United States Patent [19]
Williams et al.

[11] Patent Number: 5,485,484
[45] Date of Patent: Jan. 16, 1996

[54] DIGITALLY IMPLEMENTED PHASE AND LOCK INDICATORS FOR A BIT SYNCHRONIZER

[75] Inventors: Bruce H. Williams, Sandy; Glenn A. Arbanas; Roy E. Greeff, both of Salt Lake City, all of Utah

[73] Assignee: Unisys Corporation, Blue Bell, Pa.

[21] Appl. No.: 171,059

[22] Filed: Dec. 21, 1993

[51] Int. Cl.$^6$ .................................................. H03D 3/24
[52] U.S. Cl. ........................... 375/376; 331/4; 331/15; 331/25; 331/DIG. 2; 327/43; 327/5; 375/327; 375/328; 375/371
[58] Field of Search ........................ 375/118–120, 81, 375/82; 331/17, 18, 25, 4, 15, DIG. 2; 455/260; 307/510, 528; 327/5, 43

[56] References Cited

U.S. PATENT DOCUMENTS

| | | | |
|---|---|---|---|
| 4,419,760 | 12/1983 | Bjornhalt | 375/120 |
| 4,617,520 | 10/1986 | Lenne | 331/25 X |
| 4,780,893 | 10/1988 | Henkelman, Jr. | 375/120 |
| 4,837,781 | 6/1989 | Huckling | 375/81 |
| 5,121,071 | 6/1992 | Kelly et al. | 375/120 X |
| 5,233,636 | 8/1993 | Lee et al. | 375/120 |
| 5,301,196 | 4/1994 | Ewen et al. | 375/119 X |
| 5,313,499 | 5/1994 | Coburn | 375/119 X |

*Primary Examiner*—Stephen Chin
*Assistant Examiner*—Amanda T. Le
*Attorney, Agent, or Firm*—John B. Sowell; Mark T. Starr

[57] ABSTRACT

A bit synchronizing circuit is provided with both analog and digital devices in an enhanced bit synchronizing circuit system. There is provided a digital phase detector and a digital lock detector which are compatible with analog circuity. The output of the digital phase detector is coupled to an analog summing circuit having an output which is coupled to a low pass filter (LPF). The analog output of the LPF is coupled to the input of a voltage controlled oscillator (VCO) which produces a data rate clock. The output of the digital lock detector is coupled to an analog summing circuit having an output coupled to a low pass filter (LPF). The output of the LPF is coupled to a comparator for generating a lock indication signal output. The output of the comparator is also coupled to a sweep circuit which is coupled to an input of the voltage controlled oscillator for resolving frequency uncertainties in the bit synchronizing circuit.

6 Claims, 3 Drawing Sheets

5,485,484

DIGITALLY IMPLEMENTED PHASE AND LOCK INDICATORS FOR A BIT SYNCHRONIZER

BACKGROUND OF THE INVENTION

1. Field of the Invention

The present invention relates to a high speed symbol or bit synchronizer. More particularly, the present invention relates to a novel bit synchronizer employing novel digital phase and digital lock detectors.

2. Description of the Prior Art

In our U.S. Pat. No. 5,063,577 there is shown and described a high speed analog bit synchronizer having an analog phase detector. This prior U.S. Patent employed a plurality of electronic switches and absolute value detectors operable in a high speed analog mode. The implementation of these high speed analog devices required that the bit synchronizer be made from discrete components and assembled on a printed circuit board which resulted in a system that was large and relatively heavy, thus, not suitable for being used in high speed airborne vehicles and satellites. Because of the size and weight restrictions, this prior art bit synchronizer did not employ an analog or a digital lock detector.

It would be desirable to provide a miniature, light weight, high speed bit synchronizer for high speed airborne vehicles and satellites which preserves the desirable features of known bit synchronizers but employs more advanced subminiature components to reduce the weight and size of the bit synchronizer.

SUMMARY OF THE INVENTION

It is a principal object of the present invention to provide a phase and lock detector for a bit synchronizer designed for single chip semiconductor implementation in one of the high speed processes such as ECL, CMOS or gallium arsenide.

It is a principal object of the present invention to provide a digital phase and lock detector for a bit synchronizer designed for economic implementation on a gate array or programmable array logic chip.

It is a principal object of the present invention to provide a novel digital lock detector and a novel digital phase detector for use in a high speed analog bit synchronizer.

It is a principal object of the present invention to provide a variable rate bit synchronizer which permits the system rate to be set or modified by the rate of the data clock.

It is a principal object of the present invention to provide a digital/analog bit synchronizer having a novel digital lock detector which enhances the speed and accuracy of acquisition.

It is a principal object of the present invention to provide a novel lock detector operable to disable a sweep circuit when resolving frequency uncertainty in input data and/or correcting for the aging of the crystal in the voltage controlled oscillator.

According to these and other objects of the present invention, there is provided a novel high speed bit synchronizer which incorporates a novel digital lock detector and a novel digital phase detector in an analog bit synchronizer that permits a highly subminiaturized system embodying the best features of analog and digital bit synchronizers.

DESCRIPTION OF THE PREFERRED EMBODIMENT

Figure 1:
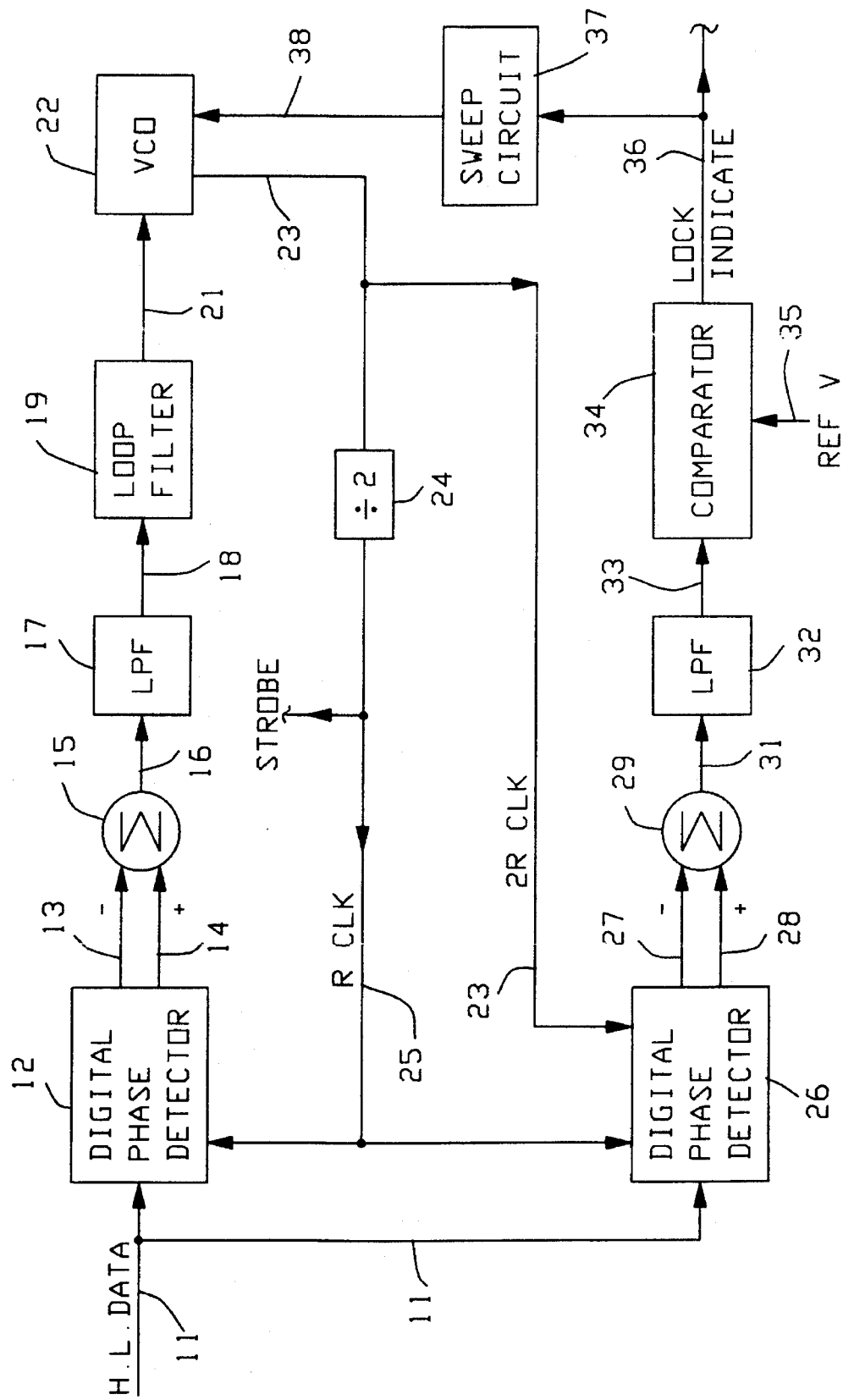
FIG. 1 is a block diagram showing a preferred embodiment of the present invention digitally implemented symbol or bit synchronizer.

Refer now to FIG. 1 showing a preferred embodiment of the present invention bit synchronizer 10. Hard limited data on line 11 is shown being applied to the input of a digital phase detector 12 which is provided with a negative output 13 and a positive output 14. The outputs of the digital phase detector are applied to the input of summing circuit 15 having an output on line 16 applied to the input of a low pass filter 17. The filtered output on line 18 is applied to the input of a loop filter 19. The output of the loop filter on line 21 is a phase error voltage which is applied to the input of a voltage controlled oscillator 22. The output of the voltage controlled oscillator on line 23 is first applied to a divide by 2 circuit 24 which produces at its output the data rate clock on line 25 which is applied to the digital phase detector 12 and to a digital lock detector 26. The digital lock detector 26 also has a twice or double data rate clock applied thereto on line 23 from the output of the VCO 22. The output of the digital lock detector 26 is shown having a negative output on line 27 and a positive output on line 28 applied to the input of a summing circuit 29. The output of the summing circuit 29 on line 31 is applied to the input of a low pass filter 32 shown having a filtered output on line 33. The filtered signal on line 33 is applied to a comparator 34 having a reference voltage input 35 for comparison purposes. The output of the comparator 34 on line 36 is a signal indicative of the locked or unlocked condition. The signal on line 36 is also applied to a sweep circuit 37 shown having an output on line 38 coupled back to the voltage controlled oscillator 22. The lock indication signals on line 36 may be used to disable the sweep circuit when resolving frequency uncertainties in the input data and/or correcting for the aging of the voltage controlled oscillator crystal.

Figure 2:
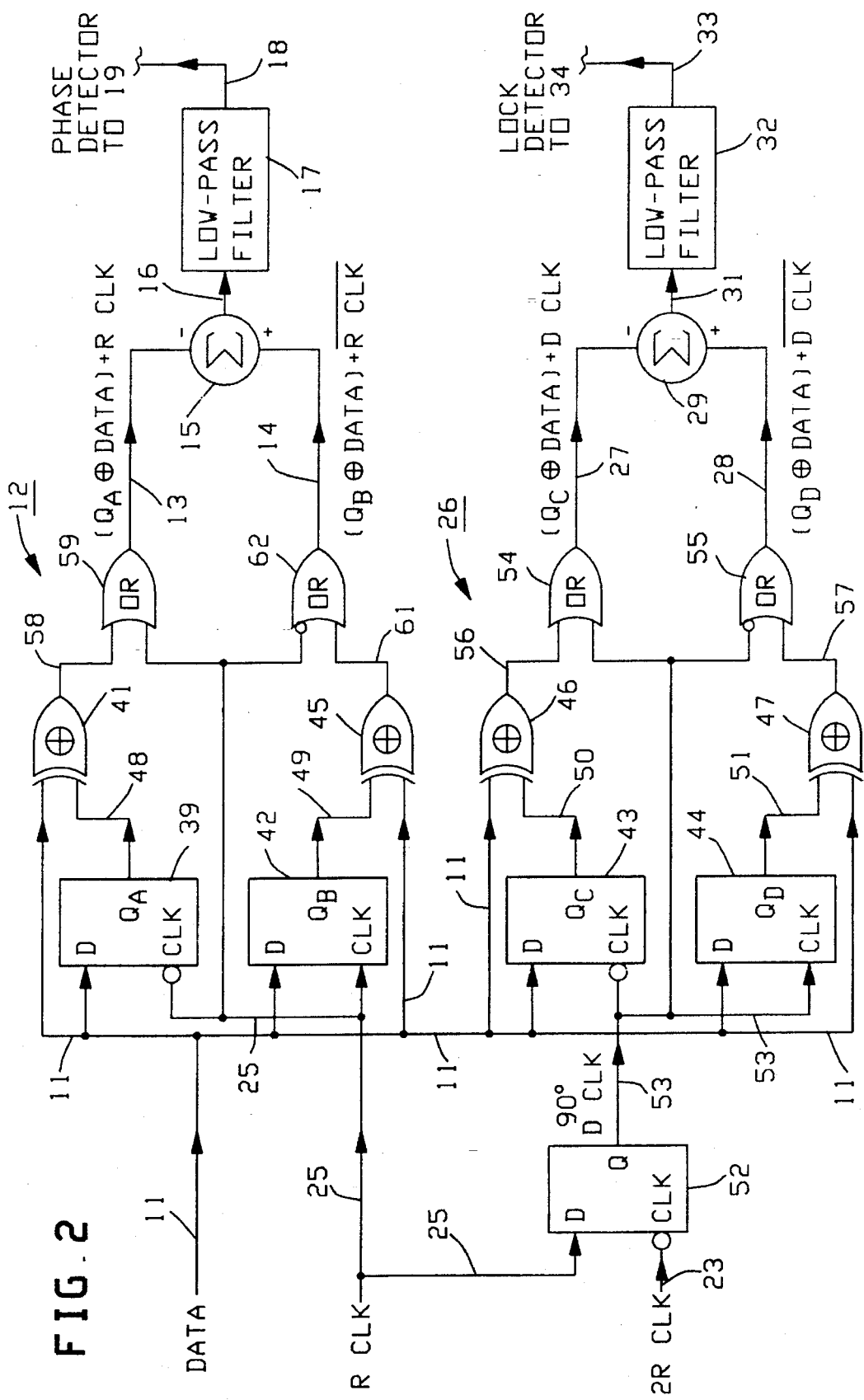
FIG. 2 is a block diagram showing a novel digital implementation of a phase and lock detector of FIG. 1.

Refer now to FIG. 2 showing a novel digital implementation of the phase and lock detectors 12 and 26 shown in FIG. 1. The hard limited data on line 11 is shown being applied to a data input of a D type flip-flop 39 and to a first input of an exclusive OR circuit 41. The hard limited data on line 11 is similarly applied to the data input of flip-flops 42 through 44 and to a first input of exclusive OR circuits 45 through 47. Flip-flop 39 is shown having a $Q_A$ output on line 48. Similarly the flip-flops 42 through 44 are shown having the $Q_B$ through $Q_D$ outputs on lines 49 through 51 applied to the second input of the exclusive OR gates 45 through 47.

The 2R clock on line 23 is shown being applied as an inverted signal to the clock input of flip-flop 52 which has a data rate clock on line 25 applied to its data input. The flip-flop 52 produces a delayed clock on line 53 which is 90° delayed and offset from the data rate clock on line 25. The delayed clock on line 53 is applied as a negative input to the flip-flop 43 and is also applied as a clock input to the flip-flop 44. The delayed clock on line 53 is further applied as a positive input and a negative input to OR gates 54 and 55, respectively.

The output of exclusive OR gate 46 on line 56 and the output of exclusive OR gate 47 on line 57 are shown being applied as the second inputs to OR gates 54 and 55. Thus, the output of OR gate 54 on line 27 is shown as a composite signal comprising $Q_c$ exclusive ORed with the data and this signal is ORed with the delayed clock on line 53. The output of OR gate 55 on line 28 is shown as a composite signal comprising $Q_b$ exclusive ORed with the data and this signal is ORed with the inverted delayed clock on line 53.

The outputs of OR gates 54 and 55 are applied as negative and positive inputs to the summing circuit 29 which has an output 31 as explained hereinbefore. The sum signal on line 31 is applied to the low pass filter 32 which produces a filtered output signal on line 33 which is offset 90° from the signal on line 18 and is also shown on FIG. 1 being applied to the comparator 34.

The output of exclusive OR gate 41 on line 58 is shown being applied to OR gate 59 to produce the aforementioned signal on line 13. The composite signal on line 13 comprises the $Q_A$ output exclusive ORed with the data and this composite signal is ORed with the data clock as an input to the negative input of the summing circuit 15. Similarly, the output of OR gate 45 on line 61 is applied as an input to the OR gate 62 to produce a composite signal on line 14 which is applied to the positive input of summing circuit 15. The composite signal on line 14 comprises the output $Q_B$ exclusive ORed with the data and this composite signal is ORed with the inverted data rate clock. As explained hereinbefore, the output of the summing circuit on line 16 is applied to the low pass filter 17, having an output 18 which is applied to the loop filter 19 as shown and described in FIG. 1.

Figure 3:
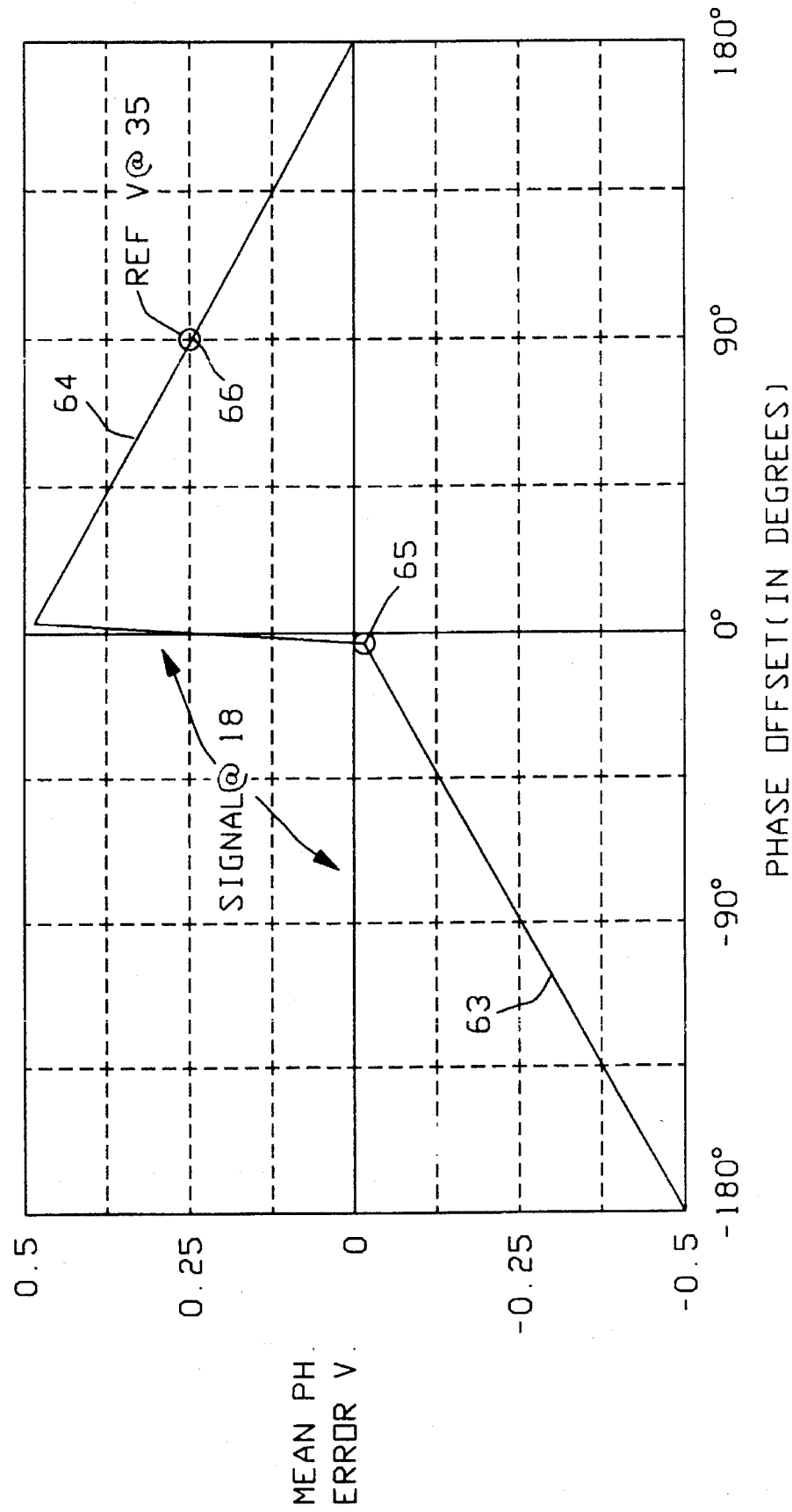
FIG. 3 is a schematic drawing of a phase S curve showing the value of the mean phase error voltage versus phase offset in degrees for the novel digital phase detector shown in FIG. 2.

Refer now to FIG. 3 showing a phase S curve, wherein the value of the phase offset in degrees is plotted versus the mean phase error in volts. The wave form shown in FIG. 3 is being produced as an output signal on line 18. This signal comprises a negative voltage portion 63 of the wave form which results from the rising edge of the clock on line 25 occurring before the zero crossover point of the hard limited data on line 11, thus producing the negative wave form shown as wave form 63 which results in slowing the rate of the voltage control oscillator 22.

The positive portion of the wave form 64 shown in FIG. 3 results from the rising edge of the clock on line 25 occurring after the zero crossover of the hard limited data on line 11, thus, generating a positive output which is applied to the VCO 22 to increase the speed of the VCO.

Having explained a preferred embodiment of FIGS. 1 through 3, it will now be understood that the portion of FIG. 2 numbered 15 through 18 and 29 through 33 are not part of the digital phase detector and digital lock detector respectively but are analog devices that are compatible with the digital portion shown in FIG. 2. It is a feature of the present invention that the digital portion of FIG. 2 may easily be implemented on a gate array or even a programmable gate array logic chip so as to miniaturize the portion of the bit synchronizer which formally required large components that occupied a large real estate on a printed circuit board. Gate arrays of the type which will accommodate the design shown in FIG. 2 are priced at several dollars and do not require a custom foundry designed chip.

It is another feature of the present invention to provide the digital lock detector 26 shown in FIGS. 1 and 2 on the same chip as the digital phase detector 12. The digital lock detector has a desirable feature in that the output signal on line 36 may be applied to a sweep circuit 37 which is coupled to the VCO 22 by line 38. This feature enables the bit synchronizer to be adjusted for aging of the crystal in the voltage controlled oscillator or to permit rapid resolution of the frequency uncertainty in the input data should it be required. Once the bit synchronizer is placed in a vehicle or satellite, the feature of being able to remotely correct for aging or data frequency uncertainty is highly desirable in that the bit synchronizer does not have to be removed from its environmental conditions to make these adjustments.

Having explained the phase offset and phase error signal with respect to FIG. 3, it will be understood that this signal is being produced at the output of the low pass filter 17 on line 18 and the negative portion of the wave form 63 will slow down the voltage control oscillator 22 and the positive portion 64 of the wave form will increase the speed of the oscillator 22, thus adjusting the digital phase detector loop so that the loop attempts to adjust the voltage control oscillator to a phase offset of zero. Once this phase offset is achieved as shown at point 65 on the wave form, the digital lock detector, which has a delayed clock on line 53, causes the signal on line 35 to appear at point 66 of the wave form 64. Thus, the reference voltage shown on line 35 when set at 0.25 volts generates the lock indication signal on line 36 as shown in FIG. 1.

What is claimed is:

1. A variable rate bit synchronizing circuit for receiving incoming data and for synchronizing a voltage controlled oscillator with a clock rate of the incoming data, comprising:

digital phase detector means having a pair of inputs connected to the incoming data and to a data rate clock for producing a pair of digital output signals, first summing means coupled to the digital outputs from said digital phase detector means, first filter means coupled to the output of said first summing means for producing a phase error signal output, a voltage control oscillator having an input coupled to the output of said filter means for producing a VCO clock output synchronized with the incoming data, a divider circuit connected in series between said VCO clock output and said digital phase detector means, digital lock detector means having inputs connected to said incoming data and to said VCO clock output from said voltage controlled oscillator and to said divider circuit for producing a pair of digital lock detection output signals, second summing means coupled to the digital outputs from said digital lock detector means, and second filter means coupled to the output of said second summing means for producing a lock detector signal indicative of a predetermined lock condition.

2. A variable rate bit synchronizer as set forth in claim 1 wherein said first filter means and said voltage controlled oscillator comprise analog devices for receiving analog input signals.

3. A variable rate bit synchronizer as set forth in claim 2 wherein said first summing circuit comprises an analog output device for receiving digital signals from said digital phase detector means.

4. A variable rate bit synchronizer as set forth in claim 2 wherein said second summing means comprises an analog output device and said second filter means comprises analog low pass filter means coupled to the output of said second summing means, and an analog comparator coupled to the output of said analog low pass filter means for producing a lock detection signal after a reference voltage is exceeded.

5. A bit synchronizing circuit as set forth in claim 4 which further includes sweep circuit means coupled between the output of said analog comparator and an input to said voltage controlled oscillator for resolving frequency uncertainties in said bit synchronizing circuit when said predetermined lock condition does not exist.

6. A variable rate bit synchronizing circuit as set forth in claim 1 wherein said digital phase detector means and said digital lock detector means comprise a plurality of flip-flops and logic gates implemented on a single gate array logic semiconductor chip.

* * * * *